US009536824B2

(12) United States Patent
Goldberger

(10) Patent No.: US 9,536,824 B2
(45) Date of Patent: Jan. 3, 2017

(54) DUAL SIDED CIRCUIT FOR SURFACE MOUNTING

(71) Applicant: ORIGIN GPS LTD., Airport City (IL)

(72) Inventor: Haim Goldberger, Modi'in (IL)

(73) Assignee: ORIGIN GPS LTD., Airport City (IL)

( * ) Notice: Subject to any disclaimer, the term of this patent is extended or adjusted under 35 U.S.C. 154(b) by 316 days.

(21) Appl. No.: 14/534,195

(22) Filed: Nov. 6, 2014

(65) Prior Publication Data

US 2016/0133561 A1  May 12, 2016

(51) Int. Cl.
*G01R 31/20* (2006.01)
*H01L 23/522* (2006.01)
*H01L 23/538* (2006.01)
*H01L 25/065* (2006.01)
*H01L 21/48* (2006.01)
*H01L 21/50* (2006.01)
*H01L 21/768* (2006.01)

(52) U.S. Cl.
CPC ....... *H01L 23/5226* (2013.01); *H01L 21/4814* (2013.01); *H01L 21/50* (2013.01); *H01L 21/768* (2013.01); *H01L 23/5385* (2013.01); *H01L 25/0652* (2013.01); *H01L 2924/0002* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| 6,049,467 | A | 4/2000 | Tamarkin et al. |
| 6,362,974 | B1 | 3/2002 | Lettang |
| 6,404,044 | B2 | 6/2002 | Akram et al. |
| 6,932,618 | B1 | 8/2005 | Nelson |
| 7,180,165 | B2 * | 2/2007 | Ellsberry .......... H01L 23/49816 257/685 |
| 7,180,171 | B1 | 2/2007 | Taheri |
| 7,937,827 | B2 | 5/2011 | Choi et al. |
| 2001/0009504 | A1 | 7/2001 | Lee |
| 2008/0230892 | A1 | 9/2008 | Chang |
| 2008/0311771 | A1 * | 12/2008 | Cho ....................... H01R 12/57 439/74 |
| 2010/0001389 | A1 | 1/2010 | Chen |
| 2012/0081864 | A1 | 4/2012 | Sakurai |
| 2013/0082386 | A1 | 4/2013 | Meyer-Berg |
| 2013/0161836 | A1 | 6/2013 | Veom |
| 2014/0175633 | A1 | 6/2014 | Lin |

FOREIGN PATENT DOCUMENTS

| EP | 2704189 | 3/2014 |
| WO | 2014/171225 | 10/2014 |

* cited by examiner

*Primary Examiner* — Tung X Nguyen
(74) *Attorney, Agent, or Firm* — Soroker Agmon Nordman

(57) ABSTRACT

A method of forming an integrated circuit, including providing a first substrate layer having a center piece and two side pieces on opposite sides of the center piece, assembling one or more circuit elements on a top side and a bottom side of the center piece of the first substrate layer, preparing two support pieces from a substrate, matching the size of the side pieces, coupling the support pieces to the bottom of the first substrate layer under the side pieces to form a second substrate layer with a void in the center under the center piece of the first substrate layer; and wherein the side pieces and support pieces include via connectors electrically connecting between a bottom side of the second substrate layer and the circuit elements.

16 Claims, 6 Drawing Sheets

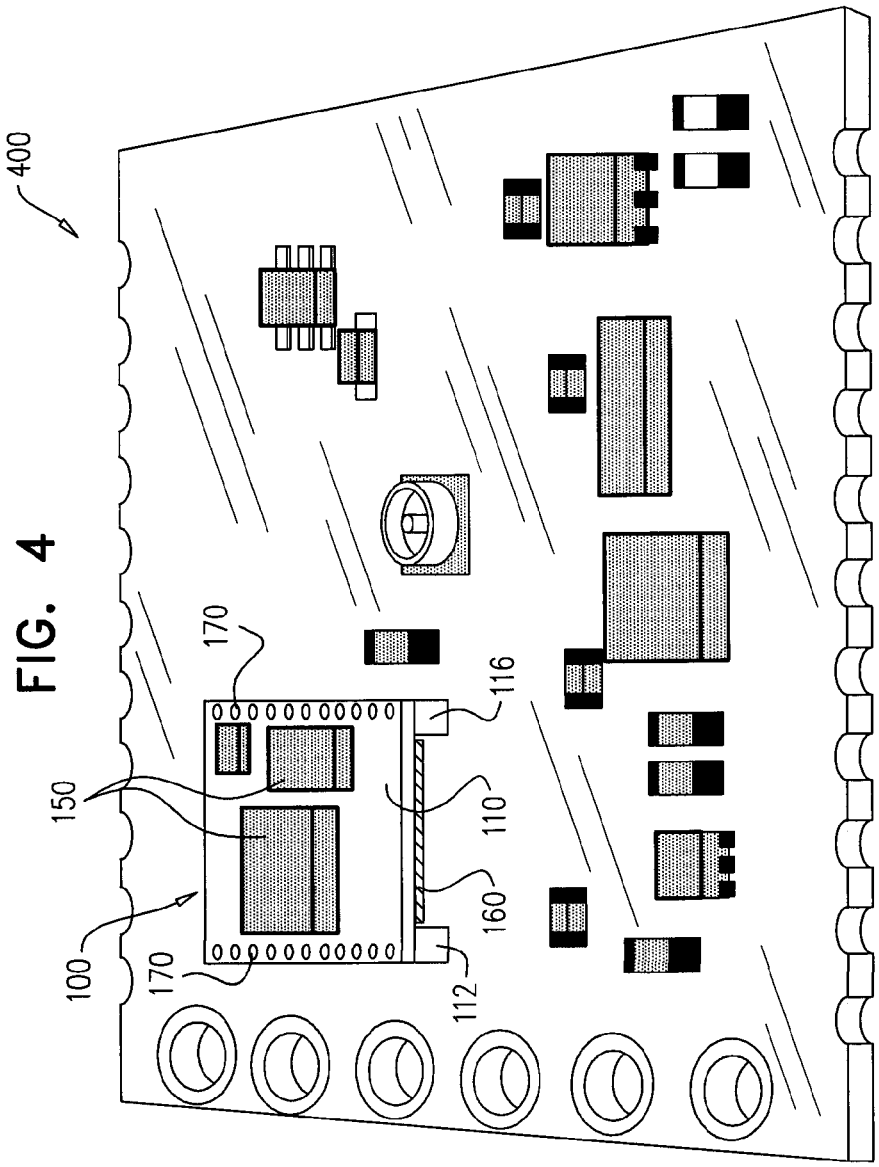

DUAL SIDED CIRCUIT FOR SURFACE MOUNTING

TECHNICAL FIELD

The present invention relates to an integrated circuit for surface mounting in a circuit, the circuit having a reduced footprint with circuit elements on two sides of a substrate.

BACKGROUND

Ever since the first integrated circuits it has been desirable to reduce their size so that they may include more complex circuitry without taking up more space. Reduced size integrated circuits generally use less power, cost less and can provide faster performance. Additionally, reduced sized integrated circuits require smaller encasements and can fit more easily into other devices, for example to add GPS functionality to a smartphone or a wristwatch.

An integrated circuit may include one or more main chips and have smaller chips and/or additional elements serving as an electrical interface for the main chips. The footprint of the integrated circuit may be reduced by stacking up multiple layers, for example the main chip on one layer and the rest of the elements on another layer. This introduces the problem of communicating electrical signals between the layers especially if they are on separate substrates (e.g. printed circuit boards), thus requiring wiring between the layers.

In some methods circuit elements may be attached to the bottom side of a substrate inside the integrated circuit. Such an attachment would then require an additional substrate below it with appropriate wiring and supports if the integrated circuit is to be surface mounted onto external circuit boards.

SUMMARY

An aspect of an embodiment of the disclosure relates to a system and method of forming an integrated circuit. The integrated circuit is produced from a first substrate layers. The substrate layer has three pieces: a center piece and side pieces on two opposite sides of the center piece.

The center piece is designed for assembling circuit elements on the top and on the bottom. The side pieces include via connectors that electrically connect between the top of the substrate, the bottom of the substrate and may connect also to circuit elements on the center piece. The connection between the circuit elements and the via connectors may be done by printing on the substrate, electrical elements or internally in the design of the substrate layer.

Two substrate pieces about the size of the side pieces are coupled to the bottom of the side pieces to support the first substrate layer and form a void under the center piece to leave room for the circuit elements attached to the bottom of the first substrate layer. The supports include via connectors that provide an electrical connection between the bottom of the support and the top. The via connectors of the supports connect to the via connectors of the side pieces and form electrical contact between the bottom of the supports and the bottom of the side pieces, which then connect to the electrical elements.

In an exemplary embodiment of the disclosure, the substrate layers are formed from wafers having multiple dies. The first substrate layer is formed from three consecutive dies. Optionally, the center die may have a different design than the side dies to enable it to accommodate circuit elements. In an exemplary embodiment of the disclosure, the side dies have an array of via connectors and may be cut so that only some of the columns of the array will remain as part of the integrated circuit.

There is thus provided according to an exemplary embodiment of the disclosure, a method of forming an integrated circuit, comprising:

Providing a first substrate layer having a center piece and two side pieces on opposite sides of the center piece;

Assembling one or more circuit elements on a top side and a bottom side of the center piece of the first substrate layer;

Preparing two support pieces from a substrate, matching the size of the side pieces;

Coupling the support pieces to the bottom of the first substrate layer under the side pieces to form a second substrate layer with a void in the center under the center piece of the first substrate layer; and Wherein the side pieces and support pieces include via connectors electrically connecting between a bottom side of the second substrate layer and the circuit elements.

In an exemplary embodiment of the disclosure, the method further comprises cutting off part of the side pieces and the support pieces along a pre-selected cut line to reduce the size of a footprint of the integrated circuit. Optionally, the support pieces are each formed from a single die of a cut up wafer. In an exemplary embodiment of the disclosure, the die of the support pieces comprise an array of via connectors that electrically connect between the top of the support piece to the bottom of the support piece. Optionally, the first substrate layer is formed from a wafer having multiple die. In an exemplary embodiment of the disclosure, the wafer includes two types of die forming a checkerboard pattern. Optionally, the integrated circuit is formed by assembling the circuit elements on one type of die and assembling the support pieces on the second type of die. In an exemplary embodiment of the disclosure, the wafer is cut up to form the integrated circuit; wherein the first substrate layer of each integrated circuit includes one die with circuit elements assembled thereon serving as the center piece and two side pieces extending from opposite sides of the center piece, each side piece having support pieces attached thereon.

There is further provided according to an exemplary embodiment of the disclosure, an integrated circuit, comprising:

A first substrate layer having a center piece and two side pieces on opposite sides of the center piece;

Circuit elements assembled on a top side and on a bottom side of the center piece of a first substrate layer;

Two support pieces made from a substrate matching the size of the side pieces;

Wherein the support pieces are coupled to the bottom of the first substrate layer under the side pieces to form a second substrate layer with a void in the center under the center piece of the first substrate layer; and Wherein the side pieces and support pieces include via connectors electrically connecting between a bottom side of the second substrate layer and the circuit elements.

In an exemplary embodiment of the disclosure, part of the side pieces and the support pieces are cut off along a pre-selected cut line to reduce the size of a footprint of the integrated circuit. Optionally, the support pieces are each formed from a single die of a cut up wafer. In an exemplary embodiment of the disclosure, the die of the support pieces comprise an array of via connectors, that electrically connect between the top of the support piece to the bottom of the support piece. Optionally, the first substrate layer is formed from a wafer having multiple die. In an exemplary embodiment of the disclosure, the wafer includes two types of die forming a checkerboard pattern. In an exemplary embodiment of the disclosure, the integrated circuit is formed by assembling the circuit elements on one type of die and assembling the support pieces on the second type of die. Optionally, the wafer is cut up to form the integrated circuit; wherein the first substrate layer of each integrated circuit includes one die with circuit elements assembled thereon serving as the center piece and two side pieces extending from opposite sides of the center piece, each side piece having support pieces attached thereon.

BRIEF DESCRIPTION OF THE DRAWINGS

The present disclosure will be understood and better appreciated from the following detailed description taken in conjunction with the drawings. Identical structures, elements or parts, which appear in more than one figure, are generally labeled with the same or similar number in all the figures in which they appear, wherein:

FIG. 4 is a schematic illustration of dual sided surface mountable integrated circuit deployed in a circuit, according to an exemplary embodiment of the disclosure.

DETAILED DESCRIPTION

Figure 1A:
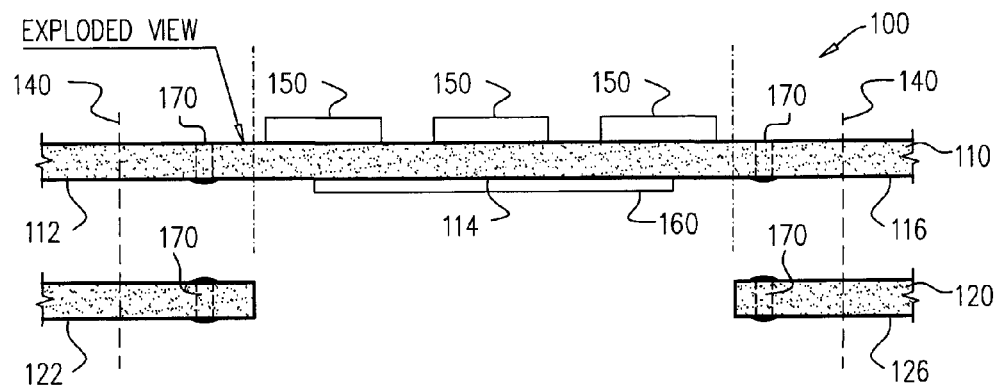
FIG. 1A is a schematic illustration of circuit on a first substrate layer with supports for assembling a dual sided surface mountable integrated circuit, according to an exemplary embodiment of the disclosure.
Figure 1B:
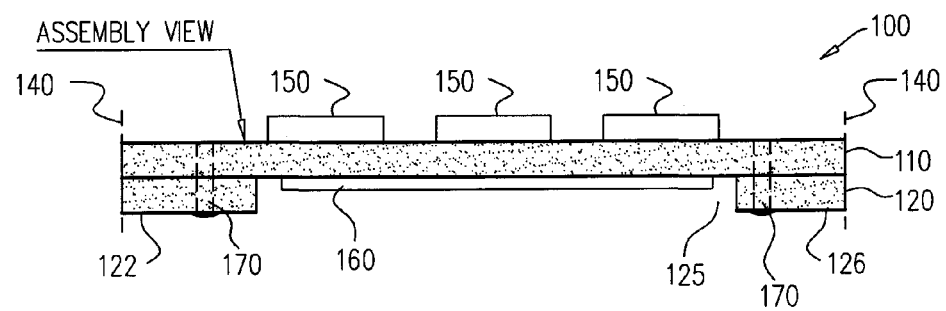
FIG. 1B is a schematic illustration of a circuit on a first substrate layer with supports coupled together to form a dual sided surface mountable integrated circuit, according to an exemplary embodiment of the disclosure.

FIG. 1A is a schematic illustration of circuit on a first substrate layer 110 with supports (122 and 126) for assembling a dual sided surface mountable integrated circuit 100 and FIG. 1B is a schematic illustration of a circuit on first substrate layer 110 coupled together with the supports (122, 126) to form dual sided surface mountable integrated circuit 100, according to an exemplary embodiment of the disclosure. In an exemplary embodiment of the disclosure, first substrate layer 110 includes three pieces a first side piece 112, a second side piece 116 and a center piece 114.

In an exemplary embodiment of the disclosure, circuit elements 150 are assembled on center piece 114 of first substrate layer 110. Optionally, one or more circuit elements 160 are assembled under center piece 114 on the bottom of first substrate layer 110. In an exemplary embodiment of the disclosure, supports 122 and 126 are placed under first side piece 112 and second side piece 116 respectively to form a second substrate layer 120 for integrated circuit 100 with a void 125 under center piece 114. Optionally, first side piece 112 and second side piece 116 include via connectors 170 that provide an electrical connection from the top side of the first substrate layer 110 to the bottom side of the first substrate layer 110. Likewise supports 122 and 126 include similar via connectors 170 for second layer 120 matching the position of via connectors 170 on the first substrate layer 110 to form an electrical connection from the electrical elements on the first substrate layer 110 to the bottom of second layer 120. In an exemplary embodiment of the disclosure, the via connectors 170 are electrically connected to the circuit elements (150, 160) mounted on center piece 114, thus forming contact between the bottom of second layer 120 and the circuit on first substrate layer 110. In some embodiments of the disclosure, the via connectors 170 on the first substrate layer 110 are not visible on the top of the first substrate layer 110.

In an exemplary embodiment of the disclosure, the substrate layers (110, 120) are coupled together using adhesives, using pressure, using solder or other methods known in the art such that the via connectors 170 of the two substrate layers are electrically connected. Accordingly, integrated circuit 100 may be surface mounted on an external electrical circuit with electrical contact between the external electrical circuit and the elements of integrated circuit 100 through the via connectors 170 of the second substrate layer 120.

In an exemplary embodiment of the disclosure, the first substrate layer 110 may comprise a single layer, dual layer or multilayer substrate to accommodate any type of electrical circuit and circuit element. Optionally, the thickness of the substrate layers may be identical or may vary depending on the requirements of the integrated circuit 100. For example the thickness of second substrate layer 120 may be selected to exactly accommodate circuit elements 160 in void 125. Optionally, the thickness may be the same as the tallest element of circuit elements 160 or may be larger leaving a space between circuit elements 160 and a substrate on which integrated circuit 100 is surface mounted.

In an exemplary embodiment of the disclosure, the first side piece 112 and second side piece 116 of first substrate layer 110 together with the supports 122, 126 are cut at a cut line 140 leaving a small portion of the side pieces with the via conneters 170 on each side in contact with the center piece 114.

Figure 1C:
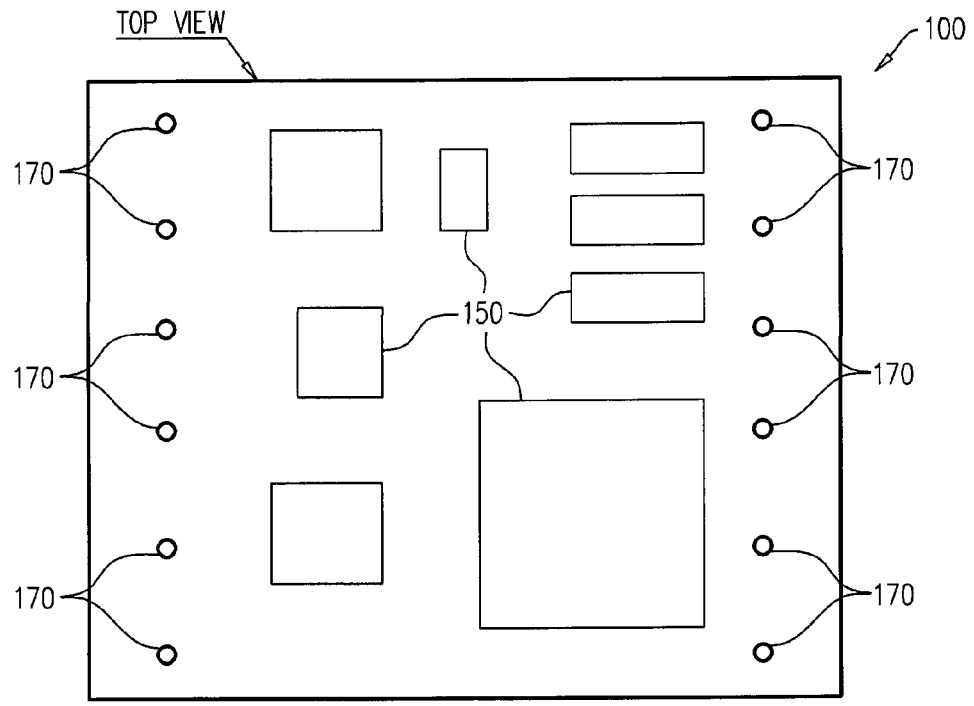
FIG. 1C is a schematic illustration of a top view of a dual ided surface mountable integrated circuit, according to an exemplary embodiment of the disclosure.
Figure 1D:
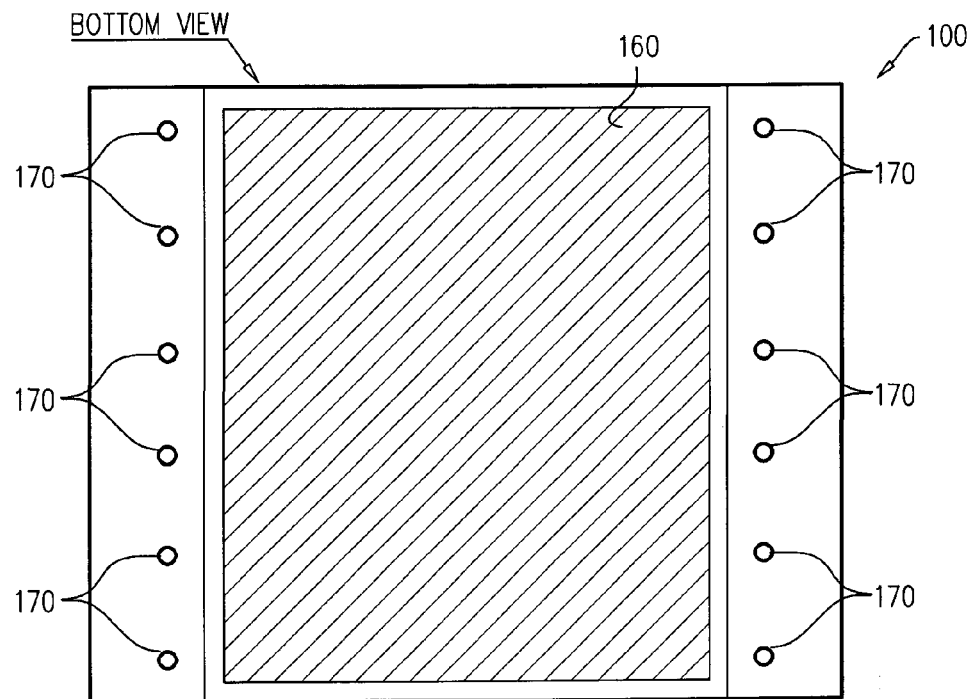
FIG. 1D is a schematic illustration of a bottom view of a dual sided surface mountable integrated circuit, according to an exemplary embodiment of the disclosure.

FIG. 1C is a schematic illustration of a top view of a dual layer surface mountable integrated circuit 100 and FIG. 1D is a schematic illustration of a bottom view of a dual layer surface mountable integrated circuit 100, according to an exemplary embodiment of the disclosure. Elements 150 can be seen in FIG. 1C on top of substrate 110 and element/elements 160 can be seen in FIG. 1D on the bottom of integrated circuit 100.

In an exemplary embodiment of the disclosure, circuit element 160 may be a GPS chip such as GSD4e-9333 manufactured by CSR plc from Cambridge England and circuit elements 150 are used to interface the GPS chip. Instead of manufacturing an integrated circuit with a large footprint (e.g. 10 mm×10 mm) to accommodate the GPS chip and the interface elements, integrated circuit 100 can be used to form an integrated circuit 100 with a footprint of less than 5 mm×5 mm (e.g. 4 mm×4 mm) providing the same functionality.

Figure 2A:
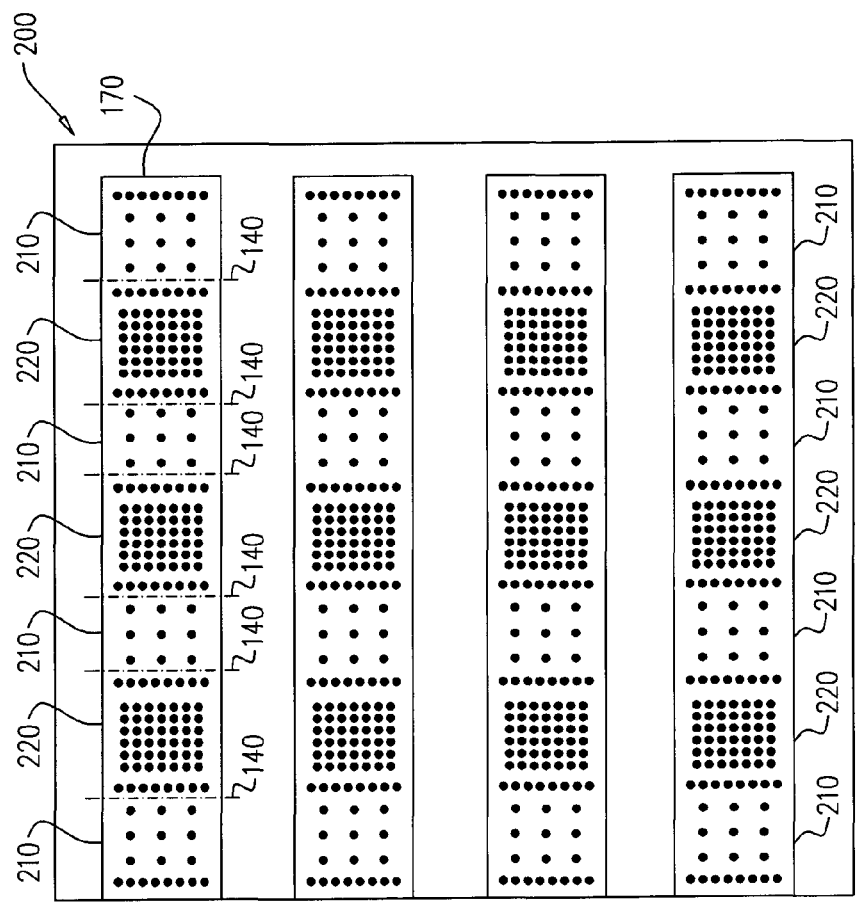
FIG. 2A is a schematic illustration of a first type of wafer of substrate dies for forming a dual sided surface mountable integrated circuit, according to an exemplary embodiment of the disclosure.
Figure 2B:
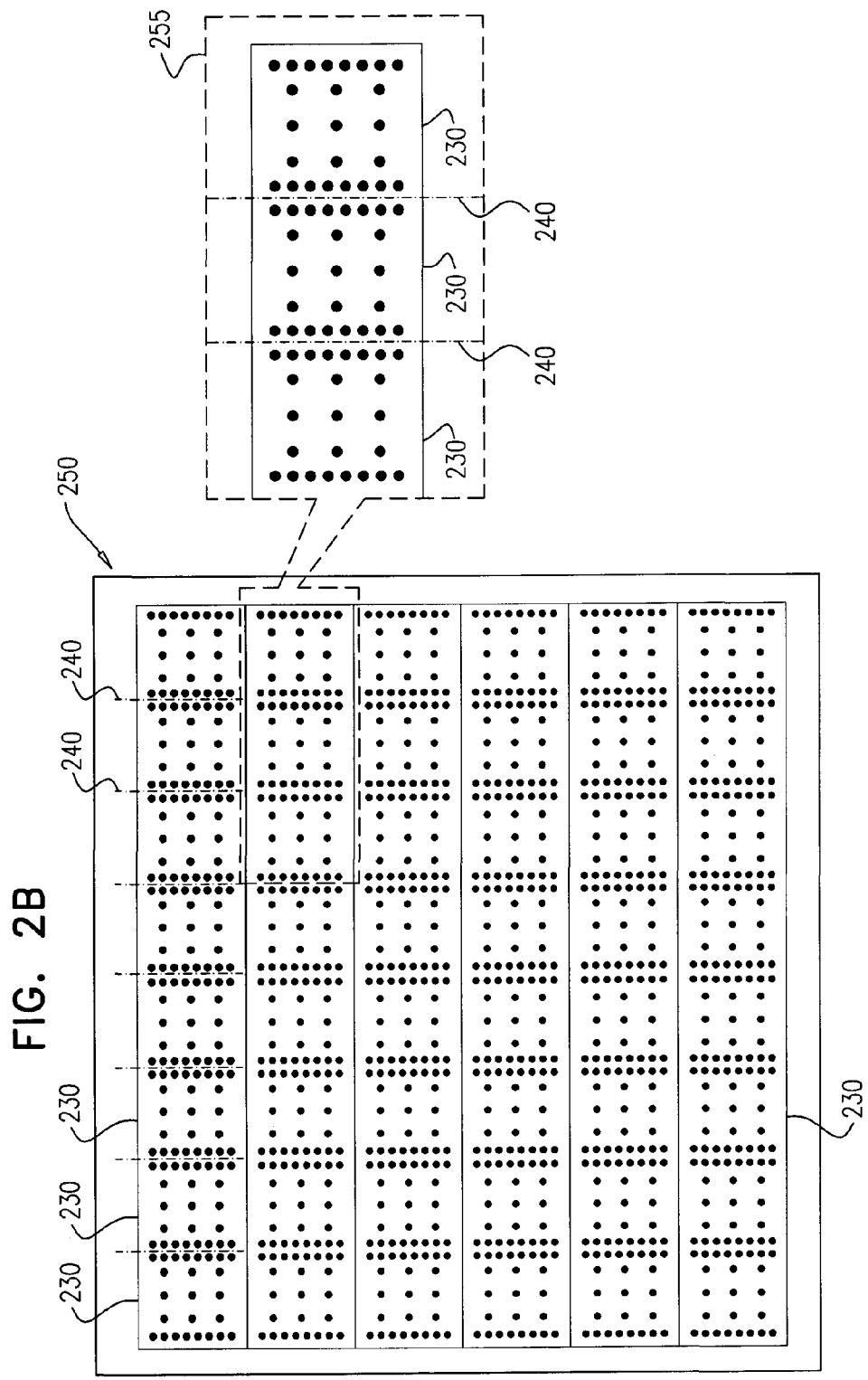
FIG. 2B is a schematic illustrations of a second type of wafer of substrate dies for forming a dual sided surface mountable integrated circuit, according to an exemplary embodiment of the disclosure.

In an exemplary embodiment of the disclosure, substrate layers (110, 120) are formed from wafers with multiple dies. FIG. 2A is a schematic illustration of a first type of wafer 200 of substrate dies for forming a multi-layer integrated circuit and FIG. 2B is a schematic illustration of a second type of wafer 250 of substrate dies for forming a multi-layer integrated circuit, according to an exemplary embodiment of the disclosure. In an exemplary embodiment of the disclosure, wafer 200 includes two types of dies (210, 220) in a checkerboard form with or without a space between each row of the wafer 200. The first type 210 serves as first side piece 112 and second side piece 116 with via connectors 170. The second type 220 serves as center piece 114 for installing elements 150 and 160.

In an exemplary embodiment of the disclosure, wafer 250 includes only one type of die 230 with via connecters 170. Optionally, die 230 are identical to die 210. Alternatively, die 230 may have via connectors 170 from the bottom to the top whereas die 210 may be manufactured having an electrical connection connecting via connectors 170 to center piece 114, either internally or on the bottom or top.

In an exemplary embodiment of the disclosure, wafer 250 is cut up entirely into die 230. Unit 255 illustrates an enlarged view of 3 die 230 with lines 240 marking the cutting position for separating the die 230.

In an exemplary embodiment of the disclosure, circuit elements 150 and 160 are assembled on die 220 of wafer 200. Likewise die 230 are coupled to die 210 on the same side as element/elements 160. After assembling elements 150, 160 and die 230 on wafer 200, wafer 200 is cut up along cut lines 140 leaving via connectors 170 from die 230 as part of integrated circuit 100.

Figure 3:
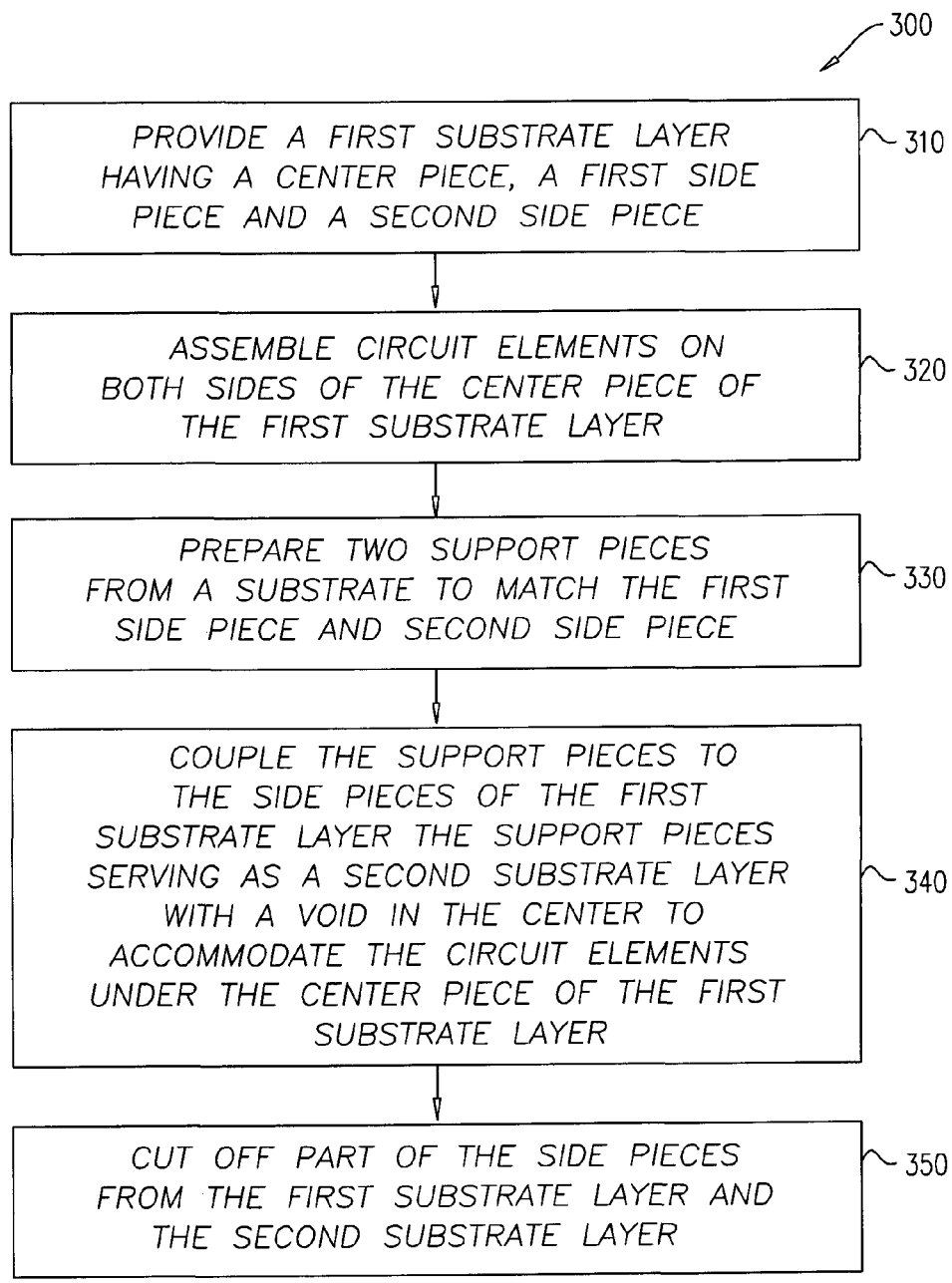
FIG. 3 is a flow diagram of a method of forming a dual sided surface mountable integrated circuit, according to an exemplary embodiment of the disclosure.

FIG. 3 is a flow diagram of a method 300 of forming a dual sided surface mountable integrated circuit 100, according to an exemplary embodiment of the disclosure.

In an exemplary embodiment of the disclosure, a first substrate layer 110 is provided (310). The first substrate layer 110 has:

(I) a center piece 114 for installing circuit elements (150, 160);
(II) a first side piece 112 on one side of the center piece 114; and
(III) a second side piece 116 on an opposite side of the center piece 114.

In an exemplary embodiment of the disclosure, the side pieces have via connectors 170 connecting between the top side and the bottom side of each substrate. Optionally, one or more circuit elements 150 are assembled (320) on the top of the center piece 114 of the first substrate layer 110 and/or one or more circuit elements 160 are assembled (320) on the bottom of the center piece 114 of the first substrate layer 110. In an exemplary embodiment of the disclosure, the via connectors 170 are electrically connected to the circuit elements (150, 160) to enable mounting the integrated circuit 100 on an external circuit.

In an exemplary embodiment of the disclosure, two support pieces (122, 126) are prepared (330) from a substrate to match the first side piece 112 and the second side piece 116 respectively. Optionally, the support pieces (122, 126) are coupled (340) to the first substrate layer 110 forming an integrated circuit 100 having a second substrate layer 120 with a void 125 to accommodate the circuit elements (160) installed under the center piece 114 of the first substrate layer 110.

In an exemplary embodiment of the disclosure, the substrate layers (110, 120) are cut (350) on cut line 140 to reduce the size of the footprint of the integrated circuit. Optionally, after cutting the substrate layers (110, 120) the via connectors 170 remain a part of the integrated circuit 100 and the rest of the side pieces (112, 116) and supports (122, 126) are removed leaving a fraction of the original pieces, for example ⅓, ¼, ⅕ or even 1/10.

FIG. 4 is a schematic illustration of dual sided surface mountable integrated circuit 100 deployed in an external circuit 400, according to an exemplary embodiment of the disclosure. As explained above first side piece 112, second side piece 116 and supports (122, 126) were cut along cut lines 140 to form the final form of integrated circuit 100. Optionally, the final form is then surface mounted onto external circuit 400

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the disclosure. Further combinations of the above features are also considered to be within the scope of some embodiments of the disclosure. It will also be appreciated by persons skilled in the art that the present disclosure is not limited to what has been particularly shown and described hereinabove.

I claim:

1. A method of forming an integrated circuit, comprising:
providing a first substrate layer having a center piece and two side pieces on opposite sides of the center piece;
assembling one or more circuit elements on a top side and a bottom side of the center piece of the first substrate layer;
preparing two support pieces from a substrate, matching the size of the side pieces;
coupling the support pieces to the bottom of the first substrate layer under the side pieces to form a second substrate layer with a void in the center under the center piece of the first substrate layer; and
wherein the side pieces and support pieces include via connectors electrically connecting between a bottom side of the second substrate layer and the circuit elements.

2. A method according to claim 1, further comprising cutting off part of the side pieces and the support pieces along a pre-selected cut line to reduce the size of a footprint of the integrated circuit.

3. A method according to claim 1, wherein the support pieces are each formed from a single die of a cut up wafer.

4. A method according to claim 3, wherein the die of the support pieces comprise an array of via connectors that electrically connect between the top of the support piece to the bottom of the support piece.

5. A method according to claim 1, wherein the first substrate layer is formed from a wafer having multiple die.

6. A method according to claim 5, wherein the wafer includes two types of die forming a checkerboard pattern.

7. A method according to claim 6, wherein the integrated circuit is formed by assembling the circuit elements on one type of die and assembling the support pieces on the second type of die.

8. A method according to claim 7, wherein the wafer is cut up to form the integrated circuit; wherein the first substrate layer of each integrated circuit includes one die with circuit elements assembled thereon serving as the center piece and two side pieces extending from opposite sides of the center piece, each side piece having support pieces attached thereon.

9. An integrated circuit, comprising:
a first substrate layer having a center piece and two side pieces on opposite sides of the center piece;

circuit elements assembled on a top side and on a bottom side of the center piece of a first substrate layer;

two support pieces made from a substrate matching the size of the side pieces;

wherein the support pieces are coupled to the bottom of the first substrate layer under the side pieces to form a second substrate layer with a void in the center under the center piece of the first substrate layer; and wherein the side pieces and support pieces include via connectors electrically connecting between a bottom side of the second substrate layer and the circuit elements.

10. An integrated circuit according to claim 9, wherein part of the side pieces and the support pieces are cut off along a pre-selected cut line to reduce the size of a footprint of the integrated circuit.

11. An integrated circuit according to claim 9, wherein the support pieces are each formed from a single die of a cut up wafer.

12. An integrated circuit according to claim 11, wherein the die of the support pieces comprise an array of via connectors that electrically connect between the top of the support piece to the bottom of the support piece.

13. An integrated circuit according to claim 9, wherein the first substrate layer is formed from a wafer having multiple die.

14. An integrated circuit according to claim 13, wherein the wafer includes two types of die forming a checkerboard pattern.

15. An integrated circuit according to claim 14, wherein the integrated circuit is formed by assembling the circuit elements on one type of die and assembling the support pieces on the second type of die.

16. An integrated circuit according to claim 15, wherein the wafer is cut up to form the integrated circuit; wherein the first substrate layer of each integrated circuit includes one die with circuit elements assembled thereon serving as the center piece and two side pieces extending from opposite sides of the center piece, each side piece having support pieces attached thereon.

* * * * *